(12) United States Patent
Shimada et al.

(10) Patent No.: US 11,174,399 B2
(45) Date of Patent: Nov. 16, 2021

(54) SURFACE TREATMENT METHOD FOR IMPARTING ALCOHOL REPELLENCY TO SEMICONDUCTOR SUBSTRATE

(71) Applicant: MITSUBISHI GAS CHEMICAL COMPANY, INC., Chiyoda-ku (JP)

(72) Inventors: Kenji Shimada, Tokyo (JP); Priangga Perdana Putra, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 202 days.

(21) Appl. No.: 16/615,920

(22) PCT Filed: Mar. 16, 2018

(86) PCT No.: PCT/JP2018/010375
§ 371 (c)(1),
(2) Date: Nov. 22, 2019

(87) PCT Pub. No.: WO2018/216326
PCT Pub. Date: Nov. 29, 2018

(65) Prior Publication Data
US 2020/0207993 A1 Jul. 2, 2020

(30) Foreign Application Priority Data
May 26, 2017 (JP) .............................. JP2017-104411

(51) Int. Cl.
| | |
|---|---|
| *H01L 21/00* | (2006.01) |
| *C09D 7/63* | (2018.01) |
| *C09D 7/61* | (2018.01) |
| *C09D 5/00* | (2006.01) |
| *H01L 21/30* | (2006.01) |
| *H01L 21/02* | (2006.01) |

(52) U.S. Cl.
CPC ................ *C09D 7/63* (2018.01); *C09D 5/00* (2013.01); *C09D 7/61* (2018.01); *H01L 21/02057* (2013.01); *H01L 21/30* (2013.01)

(58) Field of Classification Search
None
See application file for complete search history.

(56) References Cited

U.S. PATENT DOCUMENTS

| | | | |
|---|---|---|---|
| 2009/0311874 A1 | 12/2009 | Tomita et al. | |
| 2010/0075504 A1 | 3/2010 | Tomita et al. | |

(Continued)

FOREIGN PATENT DOCUMENTS

| | | |
|---|---|---|
| JP | 9-31449 A | 2/1997 |
| JP | 2005-333015 A | 12/2005 |

(Continued)

OTHER PUBLICATIONS

European Search Report dated Apr. 23, 2020 in Patent Application No. 18806052.9, 7 pages.

(Continued)

*Primary Examiner* — Reema Patel
(74) *Attorney, Agent, or Firm* — Oblon, McClelland, Maier & Neustadt, L.L.P.

(57) ABSTRACT

According to the present invention, a method for treating the surface of a semiconductor substrate can be provided, the method including bringing the semiconductor substrate into contact with a liquid composition to impart alcohol repellency to the semiconductor substrate, wherein the liquid composition is characterized by containing: 0.01 to 15% by mass of each of at least two compounds selected from surfactants respectively represented by formulae (1) to (6) and salts thereof; and water.

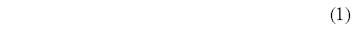

(1)

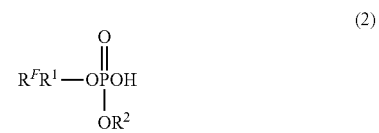

(2)

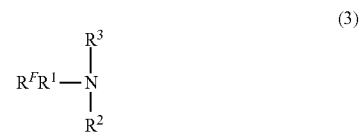

(3)

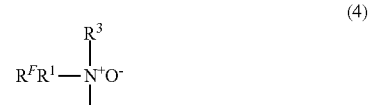

(4)

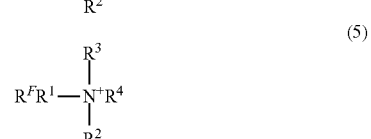

(5)

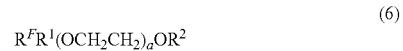

(6)

(In formulae (1) to (6), $R^F$ is selected from the group consisting of compounds in each of which a hydrogen atom in an alkyl group having 2 to 10 carbon atoms is substituted by a fluorine atom; $R^1$ is selected from the group consisting of a covalent bond, an alkylene group having 1 to 6 carbon atoms and others; $R^{HP}$ is selected from the group consisting of a hydroxyl group, a sulfonic acid group and a carboxyl group; $R^2$, $R^3$ and $R^4$ are independently selected from the group consisting of a hydrogen atom, an alkyl group having 1 to 6 carbon atoms and others; $R^5$, $R^6$ and $R^7$ are independently selected from the group consisting of a hydrogen atom, an alkyl group having 1 to 6 carbon atoms and others; $X^-$ is selected from the group consisting of a hydroxide ion and others; and a represents an integer of 3 to 20 inclusive.)

9 Claims, No Drawings

(56) References Cited

U.S. PATENT DOCUMENTS

| | | |
|---|---|---|
| 2010/0240219 A1 | 9/2010 | Tomita et al. |
| 2013/0008868 A1 | 1/2013 | Uozumi et al. |
| 2014/0065295 A1 | 3/2014 | Emoto et al. |
| 2015/0170936 A1 | 6/2015 | Westwood |
| 2016/0071747 A1 | 3/2016 | Uozumi et al. |
| 2018/0122628 A1 | 5/2018 | Mizutani et al. |
| 2019/0214277 A1 | 7/2019 | Uozumi et al. |

FOREIGN PATENT DOCUMENTS

| | | |
|---|---|---|
| JP | 2010-114414 A | 5/2010 |
| JP | 2013-16699 A | 1/2013 |
| JP | 2014-197571 A | 10/2014 |
| JP | 2014-197638 A | 10/2014 |
| WO | WO 2010/113646 A1 | 10/2010 |
| WO | WO 2017/010321 A1 | 1/2017 |

OTHER PUBLICATIONS

International Search Report dated May 22, 2018 in PCT/JP2018/010375 filed on Mar. 16, 2018, 1 page.

SURFACE TREATMENT METHOD FOR IMPARTING ALCOHOL REPELLENCY TO SEMICONDUCTOR SUBSTRATE

TECHNICAL FIELD

The present invention relates to a surface treatment method for a semiconductor substrate, which imparts alcohol repellency to the semiconductor substrate.

BACKGROUND ART

The process for producing a semiconductor device includes a step of completely removing a residue generated by dry etching treatment by using a stripping liquid and a washing liquid, and in order to remove the stripping liquid and the washing liquid from surfaces, rinsing is carried out using a solvent. This has a problem of pattern collapsing caused by the capillary force of the solvent used for rinsing.

As methods for solving the problem of pattern collapsing, a technique in which an alcohol whose surface tension is smaller than that of water is used as a solvent for rinsing, and a method in which a pattern surface is hydrophobized or oleophobized to allow the contact angle between the pattern and a solvent to be used for rinsing to be near 90°, thereby preventing pattern collapsing at the time of rinsing, are known.

For example, Patent Documents 1-3 describe a surface treatment method for a semiconductor device which has a process of forming a water-repellent protective film on a semiconductor substrate surface using a silane-based compound, subsequently rinsing the semiconductor substrate with pure water and drying it. However, the disclosed water-repellent protective film cannot provide a sufficiently large contact angle between materials formed on the semiconductor substrate and alcohols, and therefore it cannot be used for alcohols.

Patent Document 4 describes a surface treatment agent having a silane-based compound having a fluorocarbon group, an acid catalyst and a liquid-type or solid-type medium. However, the disclosed water-repellent protective film cannot provide a sufficiently large contact angle between materials formed on the semiconductor substrate and alcohols, and therefore it cannot be used for alcohols.

Patent Document 5 describes, as a surface treatment agent having isopropyl alcohol (hereinafter referred to as IPA) repellency, a copolymer of an acrylic ester having a linear perfluoroalkyl group having 6 carbon atoms and a methacrylic ester having a linear perfluoroalkyl group having 6 carbon atoms. However, when rinsing treatment is carried out using IPA without drying a surface treatment agent, the surface treatment agent on the semiconductor substrate is not cured but flowed out, and for this reason, it is impossible to form a film having oil repellency. Meanwhile, when the surface treatment agent is dried, a thick film is formed on the semiconductor substrate, and for this reason, the original function as the semiconductor cannot be exerted.

Patent Document 6 describes a method in which pretreatment is carried out with a treatment solution containing a fluorine-based polymer having a fluorine atom-containing repeat unit and then rinsing is carried out with a rinsing solution containing an organic solvent. However, the treatment solution containing the fluorine-based polymer provides a large size because the polymer is contained as a component, and for this reason, it cannot be adapted to the current semiconductor technology which requires microstructures.

PRIOR ART DOCUMENTS

Patent Documents

Patent Document 1: Japanese Laid-Open Patent Publication No. 2010-114414
Patent Document 2: Japanese Laid-Open Patent Publication No. 2014-197638
Patent Document 3: Japanese Laid-Open Patent Publication No. 2014-197571
Patent Document 4: Japanese Laid-Open Patent Publication No. H09-31449
Patent Document 5: International Publication WO2010/113646 pamphlet
Patent Document 6: International Publication WO2017/010321 pamphlet

SUMMARY OF THE INVENTION

Problems to be Solved by the Invention

The problem to be solved by the present invention is to provide a surface treatment method which imparts alcohol repellency to a semiconductor substrate in order to suppress pattern collapsing at the time of rinsing in the semiconductor production process.

Means for Solving the Problems

The present inventors diligently made researches in order to solve the above-described problem and found that the above-described problem can be solved by treating a semiconductor substrate using a liquid composition having a specific composition, and thus the present invention was achieved.

Specifically, the present invention is as described below.
[1] A surface treatment method for a semiconductor substrate, which comprises bringing the semiconductor substrate into contact with a liquid composition to impart alcohol repellency to the semiconductor substrate, wherein the liquid composition contains: 0.01 to 15% by mass of each of at least two compounds selected from surfactants respectively represented by formulae (1) to (6) and salts thereof; and water:

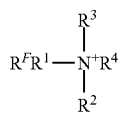

wherein:

$R^F$ is selected from the group consisting of substituents obtained by substituting a hydrogen atom with a fluorine atom in an alkyl group having 2 to 10 carbon atoms, an alkenyl group having 2 to 10 carbon atoms, an alkynyl group having 2 to 10 carbon atoms, an aryl group or an alkylether group having 2 to 10 carbon atoms;

$R^1$ is selected from the group consisting of a covalent bond, an alkylene group having 1 to 6 carbon atoms, an alkenylene group having 1 to 6 carbon atoms, an alkynylene group having 1 to 6 carbon atoms, an arylene group, an alkylene ether group having 1 to 6 carbon atoms, and a substituent obtained by substituting a hydrogen atom in any of said groups with a hydroxyl group, a carboxyl group or an amino group;

$R^{HP}$ is selected from the group consisting of a hydroxyl group, a sulfonic acid group and a carboxyl group;

$R^2$, $R^3$ and $R^4$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^FR^1$, and a substituent obtained by substituting a hydrogen atom in any of said groups with a hydroxyl group, a carboxyl group, $NR^5R^6$, $N^+O^-R^5R^6$ or $N^+R^5R^6R^7X^-$;

$R^5$, $R^6$ and $R^7$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^FR^1$, and a substituent obtained by substituting a hydrogen atom in any of said groups with a hydroxyl group, a carboxyl group or an amino group;

$X^-$ is selected from the group consisting of a hydroxide ion, a fluoride ion, a chloride ion, a bromide ion, a iodide ion, a nitrate ion, a phosphate ion, a sulfate ion, a hydrogen sulfate ion, a methanesulfate ion, a perchlorate ion, an acetate ion, a fluoroborate ion and a trifluoroacetate ion; and a represents an integer of 3 to 20.

[2] The surface treatment method for the semiconductor substrate according to item [1], wherein the surfactants do not contain any perfluoroalkyl group having 8 or more carbon atoms.

[3] The surface treatment method for the semiconductor substrate according to item [1] or [2], wherein the surfactants include a compound which contains nitrogen in a hydrophilic group thereof.

[4] The surface treatment method for the semiconductor substrate according to any one of items [1] to [3], wherein said alcohol repellency is isopropyl alcohol repellency.

[5] The surface treatment method for the semiconductor substrate according to any one of items [1] to [4], wherein the semiconductor substrate contains at least one material selected from the group consisting of silicon, aluminum, aluminum copper alloy, tantalum, nickel, tungsten, cobalt, molybdenum, titanium, zirconium, ruthenium, hafnium, platinum, silicon germanium, germanium, and an oxide, a nitride and a carbide thereof.

Advantageous Effect of the Invention

By using the surface treatment method of the present invention, in the process for manufacturing semiconductor elements, collapse of microminiaturized patterns made of various materials can be prevented, and therefore semiconductor elements having high precision and high quality can be produced with a high yield.

EMBODIMENTS FOR CARRYING OUT THE INVENTION

The liquid composition to be used in the surface treatment method of the present invention contains a specific surfactant and water. Hereinafter, these matters will be described in detail.

Surfactant

The surfactant to be used in the present invention includes at least two compounds selected from the group consisting of compounds respectively represented by formulae (1) to (6) below and salts thereof.

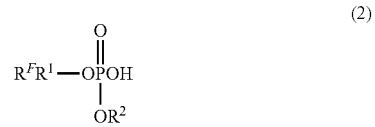

(In formulae (1) to (6):

$R^F$ is selected from the group consisting of substituents obtained by substituting a hydrogen atom with a fluorine atom in an alkyl group having 2 to 10 carbon atoms, an alkenyl group having 2 to 10 carbon atoms, an alkynyl group having 2 to 10 carbon atoms, an aryl group or an alkylether group having 2 to 10 carbon atoms;

$R^1$ is selected from the group consisting of a covalent bond, an alkylene group having 1 to 6 carbon atoms, an alkenylene group having 1 to 6 carbon atoms, an alkynylene group having 1 to 6 carbon atoms, an arylene group, an alkylene ether group having 1 to 6 carbon atoms, and a substituent obtained by substituting a hydrogen atom in any of said groups with a hydroxyl group, a carboxyl group or an amino group;

$R^{HP}$ is selected from the group consisting of a hydroxyl group, a sulfonic acid group and a carboxyl group;

$R^2$, $R^3$ and $R^4$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^F R^1$, and a substituent obtained by substituting a hydrogen atom in any of said groups with a hydroxyl group, a carboxyl group, $NR^5R^6$, $N^+O^-R^5R^6$ or $N^+R^5R^6R^7X^-$;

$R^5$, $R^6$ and $R^7$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^F R^1$, and a substituent obtained by substituting a hydrogen atom in any of said groups with a hydroxyl group, a carboxyl group or an amino group;

$X^-$ is selected from the group consisting of a hydroxide ion, a fluoride ion, a chloride ion, a bromide ion, a iodide ion, a nitrate ion, a phosphate ion, a sulfate ion, a hydrogen sulfate ion, a methanesulfate ion, a perchlorate ion, an acetate ion, a fluoroborate ion and a trifluoroacetate ion; and a represents an integer of 3 to 20.)

Specific examples of the surfactant to be used in the present invention include $C_9F_{21}OH$, $C_8F_{19}OH$, $C_7F_{17}OH$, $C_6F_{15}OH$, $C_5F_{13}OH$, $C_4F_{11}OH$, $C_3F_9OH$, $C_2F_7OH$, $C_9F_{21}SO_3H$, $C_8F_{19}SO_3H$, $C_7F_{17}SO_3H$, $C_6F_{15}SO_3H$, $C_5F_{13}SO_3H$, $C_4F_{11}SO_3H$, $C_3F_9SO_3H$, $C_2F_7SO_3H$, $C_9F_{21}COOH$, $C_8F_{19}COOH$, $C_7F_{17}COOH$, $C_6F_{15}COOH$, $C_5F_{13}COOH$, $C_4F_{11}COOH$, $C_3F_9COOH$, $C_2F_7COOH$, $C_9F_{21}CH_2OH$, $C_8F_{19}CH_2OH$, $C_7F_{17}CH_2OH$, $C_6F_{15}CH_2OH$, $C_5F_{13}CH_2OH$, $C_4F_{11}CH_2OH$, $C_3F_9CH_2OH$, $C_2F_7CH_2OH$, $C_9F_{21}OPO(OH)_2$, $C_8F_{19}OPO(OH)_2$, $C_7F_{17}OPO(OH)_2$, $C_6F_{15}OPO(OH)_2$, $C_5F_{13}OPO(OH)_2$, $C_4F_{11}OPO(OH)_2$, $C_3F_9OPO(OH)_2$, $C_2F_7OPO(OH)_2$, $C_9F_{21}NH_2$, $C_8F_{19}NH_2$, $C_7F_{17}NH_2$, $C_6F_{15}NH_2$, $C_5F_{13}NH_2$, $C_4F_{11}NH_2$, $C_3F_9NH_2$, $C_2F_7NH_2$, $C_9F_{21}CH_2NH_2$, $C_8F_{19}CH_2NH_2$, $C_7F_{17}CH_2NH_2$, $C_6F_{15}CH_2NH_2$, $C_5F_{13}CH_2NH_2$, $C_4F_{11}CH_2NH_2$, $C_3F_9CH_2NH_2$, $C_2F_7CH_2NH_2$, $[C_6F_{15}(CH_2)_2OCH_2CH(OH)CH_2O]_2PO(OH)$, $(C_6F_{15}CH_2CH(OH)CH_2)_2N(CH_2)_3N^+(CH_3)(CH_2CH_3)_2F^-$, $(C_6F_{15}CH_2CH(OH)CH_2)_2N(CH_3)_2N^+(CH_3)(CH_2CH_3)_2Cl^-$, $(C_6F_{15}CH_2CH(OH)CH_2)_2N(CH_3)_2N^+(CH_3)(CH_2CH_3)_2Br^-$, $(C_6F_{15}CH_2CH(OH)CH_2)_2N(CH_2)_3N^+(CH_3)(CH_2CH_3)_2I^-$, $C_6F_{15}CH_2CH(OH)CH_2NH(CH_2)_3N^+(CH_2CH_3)_2O^-$ and $C_6F_{15}C=C(CF_3)(OCH_2CH_2)_aOCH_3$.

Among them, a compound which does not contain any perfluoroalkyl group having 8 or more carbon atoms, and a compound which contains nitrogen in a hydrophilic group thereof are preferred.

These compounds can suitably modify a substrate surface to allow to exert high IPA repellency.

Further, among compounds represented by formula (1), $CF_3(CF_2)_6CH_2OH$, $(CF_3)_2CH_2OH$, $CF_3(CF_2)_7SO_3H$ and $CF_3(CF_2)_5COOH$ are preferred. Among compounds represented by formula (2), $[CF_3(CF_2)_5(CH_2)_2OCH_2CH(OH)CH_2O]_2PO(OH)$ is preferred. Among compounds represented by formula (3), $CF_3(CF_2)_4CH_2NH_2$ and $(CF_3(CF_2)_5CH_2CH(OH)CH_2)_2N(CH_2)_3N^+(CH_3)(CH_2CH_3)_2I^-$ are preferred. Among compounds represented by formula (4), $CF_3(CF_2)_5CH_2CH(OH)CH_2NH(CH_2)_3N^+(CH_2CH_3)_2O^-$ is preferred. Among compounds represented by formula (5), $CF_3(CF_2)_5CH_2CH(OH)CH_2N^+H(CH_2COO^-)(CH_2)_3N(CH_2CH_3)_2$ is preferred. Among compounds represented by formula (6), $((CF_3)_2CF)_2C=C(CF_3)(OCH_2CH_2)_aOCH_3$ is preferred.

The content of each type of the surfactant contained in the liquid composition is 0.01 to 15% by mass, preferably 0.05 to 10% by mass, and more preferably 0.1 to 5% by mass. When the content is within the above-described range, homogeneity of the solution can be ensured while maintaining high IPA repellency. In the present invention, at least two compounds selected from surfactants respectively represented by formulae (1) to (6) and salts thereof are contained in the liquid composition. Therefore, when two types of surfactants are contained, the total content of the surfactants is 0.02 to 30% by mass, and when three types of surfactants are contained, the total content of the surfactants is 0.03 to 45% by mass.

Water

The water to be used in the present invention is preferably water from which metal ions, organic impurities, particles, etc. have been removed by distillation, ion exchange treatment, filtering treatment, adsorption treatment or the like, and pure water and ultrapure water are particularly preferred.

The content of the water in the liquid composition is 5 to 99.98% by mass, preferably 8 to 99.95% by mass, and particularly preferably 10 to 99.9% by mass.

Other Components

Other than the above-described materials, an organic solvent may also be added to the liquid composition in the present invention in order to prevent phase separation and white turbidity. In addition, additives conventionally used in liquid compositions for semiconductors may also be blended within a range in which the effects of the present invention are not reduced. For example, an acid, an alkali, a chelating agent, a defoaming agent, etc. can be added.

Method for Preparing Liquid Composition

In the present invention, the liquid composition can be prepared by homogeneously mixing the above-described surfactants, water, and according to need, the other components. The mixing method is not limited, and a general mixing method can be arbitrarily used.

Surface Treatment Method for Semiconductor Substrate

By using the liquid composition of the present invention, an alcohol-repellent film can be formed on the semiconductor substrate. The alcohol to be targeted for alcohol repellency is not limited, and examples thereof include methanol, ethanol, 1-butanol, 1-propanol and IPA. Among them, IPA is preferred because the surface tension thereof is small and a clean product which can be used for washing semiconductors can be easily obtained.

The semiconductor substrate to be targeted by the present invention is not limited, and specific examples thereof include silicon, aluminum, aluminum copper alloy, tantalum, nickel, tungsten, cobalt, molybdenum, titanium, zirconium, ruthenium, hafnium, platinum, silicon germanium, germanium, and an oxide, a nitride and a carbide thereof. The substrate may contain two or more of the above-described materials.

The method for bringing the semiconductor substrate into contact with the liquid composition of the present invention is not particularly limited. For example, a method in which the semiconductor substrate is immersed in the liquid composition, or a method in which the semiconductor substrate is brought into contact with the liquid composition by means of dropping, spraying or the like can be employed.

The temperature for use of the liquid composition of the present invention is usually 20 to 80° C., preferably 25 to 70° C., and can be suitably selected depending on the semiconductor substrate to be used.

The time for contact with the liquid composition of the present invention is usually 0.3 to 20 minutes, preferably 0.5 to 10 minutes, and can be suitably selected depending on the semiconductor substrate to be used.

EXAMPLES

Hereinafter, the present invention will be specifically described based on working examples, but embodiments can be suitably changed within a range in which the effects of the present invention are exerted.

Contact Angle Measurement Device

The contact angle was measured using a contact angle meter DM701 manufactured by Kyowa Interface Science Co., Ltd.

Experiment Operation

The experiment operation common to Examples and Comparative Examples is as described below.

A wafer manufactured by Advantec in which a film of each material (5000 Å of silicon oxide, 3000 Å of silicon nitride, 1000 Å of aluminum oxide, 1000 Å of aluminum copper alloy, 1000 Å of tantalum, 5460 Å of nickel, 1000 Å of tantalum nitride, 3000 Å of tungsten oxide, 2200 Å of tungsten, 1000 Å of cobalt, 1000 Å of molybdenum or 2000 Å of titanium nitride) is formed on a Si substrate was treated with a predetermined liquid composition at a predetermined immersion temperature for a predetermined immersion time. After that, it was immersed in IPA to rinse an excess of the liquid composition. The remaining IPA on the surfaces was removed by blowing dry nitrogen gas. The contact angle between IPA and the substrate material after the surface treatment was measured, and the case where the contact angle was 30° or more was regarded as acceptable.

Examples 1-38

The substrate materials were treated with the respective liquid compositions described in Table 2 under conditions described in Table 3. In all the cases, the contact angle with IPA was 30° or more and alcohol repellency was possessed.

Comparative Examples 1-10

The substrate materials were treated with the respective liquid compositions 5A to 5J described in Table 5 under conditions described in Table 6. In all the cases, the contact angle with IPA was less than 30°. From the results, it was understood that a substrate material after immersed in a liquid composition containing only one type of a surfactant does not exert alcohol repellency.

Comparative Examples 11-13

The substrate materials were treated with the respective liquid compositions 5K to 5M described in Table 5 under conditions described in Table 6. In all the cases, the contact angle with IPA was less than 30°. From the results, it was understood that a substrate material after immersed in a liquid composition in which one type of a surfactant does not contain any perfluoroalkyl group (not satisfying any of formulae (1) to (6)) does not exert alcohol repellency.

Comparative Examples 14-28

The substrate materials were treated with the respective liquid compositions 7A, 7B, 7C and 7D described in Table 7 under conditions described in Table 8. In all the cases, the contact angle with IPA was less than 30°. The contact angle between water and the substrate material that was not immersed in the liquid composition was 4°. Since the contact angle between water and the substrate material after immersed in the liquid composition was 30° or more, it can be judged that the surface treatment using the liquid composition succeeded. From the results, it was understood that substrate materials after immersed in the silane-based compounds having an alkyl group described in Patent Documents 1, 2 and 3 (not satisfying any of formulae (1) to (6)) do not exert alcohol repellency.

Comparative Examples 29-36

The experiment was carried out for comparison between the effects of the silane-based compound having a fluorine-containing alkyl group described in Patent Document 4 and the effects of the present invention. In the invention described in Patent Document 4, one or both of the silane-based compound having a fluorine-containing alkyl group and an acid catalyst were microencapsulated, the materials were mixed, and then the mixture was applied to the substrate surface while breaking microcapsules. By this operation, decomposition of the silane-based compound during the period between blending and applying can be prevented. Therefore, it was considered that even without microencapsulation, the effects of the invention described in Patent Document 4 can be reproduced by mixing the silane-based compound and the acid catalyst and rapidly treating the substrate material. Regarding the substrate materials after the surface treatment using the liquid composition of 7E in Table 7 (not containing two or more of the compounds represented by formulae (1) to (6)), the contact angle with IPA was less than 30°, and none of the substrate materials after the treatment had alcohol repellency.

TABLE 1

| Type | Number of formula | Name or structure of compound Specific number and structure |
|---|---|---|
| 1A | (1) | $CF_3(CF_2)_6CH_2OH$<br>$R^F$: alkyl group having 7 carbon atoms, $R^1$: alkyl chain having a carbon atom, $R^{HP}$: hydroxyl group |
| 1B | (1) | $(CF_3)_2CH_2OH$<br>$R^F$: alkyl group having 2 carbon atoms, $R^1$: alkyl chain having a carbon atom, $R^{HP}$: hydroxyl group |
| 1C | (1) | $CF_3(CF_2)_7SO_3H$<br>$R^F$: alkyl group having 8 carbon atoms, $R^1$: covalent bond, $R^{HP}$: sulfonic acid group |
| 1D | (1) | $CF_3(CF_2)_5COOH$<br>$R^F$: alkyl group having 6 carbon atoms, $R^1$: covalent bond, $R^{HP}$: carboxyl group |
| 1E | (2) | $[CF_3(CF_2)_5(CH_2)_2OCH_2CH(OH)CH_2O]_2PO(OH)$<br>$R^F$: alkyl group having 6 carbon atoms, $R^1$: one hydrogen atom in alkylether chain having 5 carbon atoms is substituted with hydroxyl group, $R^2$: $R^F R^1$ |
| 1F | (3) | $CF_3(CF_2)_4CH_2NH_2$<br>$R^F$: alkyl group having 5 carbon atoms, $R^1$: alkyl chain having a carbon atom, $R^2$: hydrogen, $R^3$: hydrogen |
| 1G | (3) | $(CF_3(CF_2)_5CH_2CH(OH)CH_2)_2N(CH_2)_3N^+(CH_3)(CH_2CH_3)_2 I^-$<br>$R^F$: alkyl group having 6 carbon atoms, $R^1$: one hydrogen atom in alkyl chain having 3 carbon atoms is substituted with hydroxyl group, $R^2$: $R^F R^1$, $R^3$: one hydrogen atom in alkyl chain having 3 carbon atoms is substituted with $N^+R^5R^6R^7X^-$, $R^5$: ethyl group, $R^6$: ethyl group, $R^7$: methyl group, $X^-$: iodide ion |
| 1H | (4) | $CF_3(CF_2)_5CH_2CH(OH)CH_2NH(CH_2)_3N^+(CH_2CH_3)_2O^-$<br>$R^F$: alkyl group having 6 carbon atoms, $R^1$: one hydrogen atom in alkyl chain having 3 carbon atoms is substituted with hydroxyl group, $R^2$: hydrogen, $R^3$: one hydrogen atom in alkyl chain having 3 carbon atoms is substituted with $N^+O^-R^5R^6$, $R^5$: ethyl group, $R^6$: ethyl group |
| 1I | (5) | $CF_3(CF_2)_5CH_2CH(OH)CH_2N^+H(CH_2COO^-)(CH_2)_3N(CH_2CH_3)_2$<br>$R^F$: alkyl group having 6 carbon atoms, $R^1$: one hydrogen atom in alkyl chain having 3 carbon atoms is substituted with hydroxyl group, $R^2$: one hydrogen atom in alkyl group having a carbon atom is substituted with carboxyl group, $R^3$: hydrogen, $R^4$: one hydrogen atom in alkyl chain having 3 carbon atoms is substituted with $NR^5R^6$, $R^5$: ethyl group, $R^6$: ethyl group |
| 1J | (6) | $((CF_3)_2CF)_2C=C(CF_3)(OCH_2CH_2)_aOCH_3$<br>$R^F$: alkenyl group having 9 carbon atoms, $R^1$: covalent bond, $R^2$: alkyl group having a carbon atom |

TABLE 2

| Liquid composition | Surfactant Type | Surfactant Concentration % by mass | Surfactant Type | Surfactant Concentration % by mass | Organic solvent Name | Organic solvent Concentration % by mass | Additive Name | Additive Concentration % by mass | Water Concentration % by mass |
|---|---|---|---|---|---|---|---|---|---|
| 2A | 1A | 1 | 1E | 1 | IPA | 40 | | | 58 |
| 2B | 1A | 1 | 1G | 1.35 | | | Sulfuric acid | 0.1 | 97.55 |
| 2C | 1A | 1 | 1H | 1.35 | | | Sulfuric acid | 0.1 | 97.55 |
| 2D | 1B | 1.35 | 1I | 1 | | | Sulfuric acid | 0.1 | 97.55 |
| 2E | 1C | 1.35 | 1I | 1 | | | Sulfuric acid | 0.1 | 97.55 |
| 2F | 1D | 1 | 1G | 1.35 | | | Sulfuric acid | 0.1 | 97.55 |
| 2G | 1E | 1 | 1F | 1 | IPA | 40 | | | 58 |
| 2H | 1E | 1 | 1G | 1 | IPA | 40 | | | 58 |
| 2I | 1E | 5 | 1G | 5 | IPA | 40 | | | 50 |
| 2J | 1E | 0.5 | 1G | 0.5 | IPA | 40 | | | 59 |
| 2K | 1E | 0.05 | 1G | 0.05 | IPA | 40 | | | 59.9 |
| 2L | 1E | 1 | 1G | 0.1 | IPA | 40 | | | 58.9 |
| 2M | 1E | 0.1 | 1G | 1 | IPA | 40 | | | 58.9 |
| 2N | 1E | 1 | 1H | 1 | IPA | 40 | | | 58 |
| 2O | 1E | 1 | 1I | 1 | IPA | 40 | | | 58 |
| 2P | 1E | 1 | 1I | 1 | Acetone | 40 | | | 58 |
| 2Q | 1E | 1 | 1I | 1 | DMF | 40 | | | 58 |
| 2R | 1E | 1 | 1G | 1 | IPA | 40 | | | 58 |
| 2S | 1F | 1 | 1G | 1.35 | | | Sulfuric acid | 0.1 | 97.55 |
| 2T | 1G | 1.35 | 1I | 1.35 | | | Sulfuric acid | 0.02 | 97.28 |
| 2U | 1J | 0.5 | 1H | 0.5 | IPA | 40 | Sulfuric acid | 0.03 | 58.97 |
| 2V | 1J | 0.5 | 1H | 0.5 | | | Sulfuric acid | 0.1 | 98.9 |

TABLE 3

| Examples | Liquid composition | Substrate material | Temperature/ °C. | Immersion time/ min | IPA contact angle/ degree |
|---|---|---|---|---|---|
| 1 | 2A | Silicon oxide | 25 | 2 | 30 |
| 2 | 2B | Silicon oxide | 25 | 2 | 41 |
| 3 | 2C | Silicon oxide | 25 | 2 | 38 |
| 4 | 2D | Silicon oxide | 25 | 2 | 31 |
| 5 | 2E | Silicon oxide | 25 | 2 | 30 |
| 6 | 2F | Silicon oxide | 25 | 2 | 37 |
| 7 | 2G | Silicon oxide | 25 | 2 | 32 |
| 8 | 2H | Silicon oxide | 25 | 0.25 | 40 |
| 9 | 2H | Silicon oxide | 25 | 1 | 43 |
| 10 | 2H | Silicon oxide | 25 | 2 | 45 |
| 11 | 2H | Silicon oxide | 25 | 10 | 44 |
| 12 | 2H | Silicon oxide | 25 | 30 | 40 |
| 13 | 2H | Silicon oxide | 25 | 60 | 45 |
| 14 | 2H | Silicon oxide | 60 | 2 | 46 |
| 15 | 2H | Silicon oxide | 80 | 2 | 48 |
| 16 | 2H | Silicon nitride | 25 | 2 | 44 |
| 17 | 2H | Aluminum oxide | 25 | 2 | 52 |
| 18 | 2H | Aluminum copper alloy | 25 | 2 | 57 |
| 19 | 2H | Tantalum | 25 | 10 | 38 |
| 20 | 2H | Nickel | 25 | 2 | 50 |
| 21 | 2H | Tantalum nitride | 25 | 2 | 44 |
| 22 | 2H | Tungsten oxide | 25 | 2 | 42 |
| 23 | 2H | Tungsten | 25 | 2 | 37 |
| 24 | 2H | Cobalt | 25 | 2 | 53 |
| 25 | 2H | Molybdenum | 25 | 2 | 39 |
| 26 | 2H | Titanium nitride | 25 | 2 | 53 |
| 27 | 2I | Silicon oxide | 25 | 2 | 44 |
| 28 | 2J | Silicon oxide | 25 | 2 | 41 |
| 29 | 2K | Silicon oxide | 25 | 2 | 38 |
| 30 | 2L | Silicon oxide | 25 | 2 | 40 |
| 31 | 2M | Silicon oxide | 25 | 2 | 41 |
| 30 | 2N | Silicon oxide | 25 | 2 | 43 |
| 31 | 2O | Silicon oxide | 25 | 2 | 50 |
| 32 | 2P | Silicon oxide | 25 | 2 | 44 |
| 33 | 2Q | Silicon oxide | 25 | 2 | 41 |
| 34 | 2R | Silicon nitride | 25 | 2 | 45 |
| 35 | 2S | Silicon oxide | 25 | 2 | 32 |
| 36 | 2T | Silicon oxide | 25 | 2 | 35 |
| 37 | 2U | Silicon oxide | 25 | 2 | 34 |
| 38 | 2V | Silicon oxide | 25 | 2 | 42 |

TABLE 4

| Type | Number of formula | Name or structure of compound Specific number and structure |
|---|---|---|
| 4A | Similar to (1) | $CH_3(CH_2)_5OH$<br>Fluorine atom in $R^F$ is substituted with hydrogen atom |
| 4B | Similar to (2) | $[CH_3(CH_2)_{11}O]_2PO(OH)$<br>Fluorine atom in $R^F$ is substituted with hydrogen atom |
| 4C | Similar to (3) | $CH_3(CH_2)_5NH_2$<br>Fluorine atom in $R^F$ is substituted with hydrogen atom |

TABLE 5

| Liquid composition | Surfactant Type | Surfactant Concentration % by mass | Surfactant Type | Surfactant Concentration % by mass | Additive Name | Additive Concentration % by mass | Water Concentration % by mass |
|---|---|---|---|---|---|---|---|
| 5A | 1A | 1 | | | IPA | 40 | 59 |
| 5B | 1B | 1 | | | | | 99 |
| 5C | 1C | 1 | | | | | 99 |
| 5D | 1D | 1 | | | | | 99 |
| 5E | 1E | 1 | | | IPA | 40 | 59 |
| 5F | 1F | 1 | | | IPA | 40 | 59 |
| 5G | 1G | 1 | | | IPA | 40 | 59 |
| 5H | 1H | 1 | | | IPA | 40 | 59 |
| 5I | 1I | 1 | | | IPA | 40 | 59 |

TABLE 5-continued

| Liquid composition | Surfactant Type | Surfactant Concentration % by mass | Surfactant Type | Surfactant Concentration % by mass | Additive Name | Additive Concentration % by mass | Water Concentration % by mass |
|---|---|---|---|---|---|---|---|
| 5J | 1J | 1 | | | IPA | 40 | 59 |
| 5K | 1E | 1 | 4A | 1 | IPA | 40 | 58 |
| 5L | 1G | 1 | 4B | 1 | IPA | 40 | 58 |
| 5M | 1E | 1 | 4C | 1 | IPA | 40 | 58 |

TABLE 6

| Comparative Examples | Liquid composition | Substrate material | Temperature/ °C. | Immersion time/ min | IPA contact angle/ degree |
|---|---|---|---|---|---|
| 1 | 5A | Silicon oxide | 25 | 10 | 15 |
| 2 | 5B | Silicon oxide | 25 | 10 | <10 |
| 3 | 5C | Silicon oxide | 25 | 10 | <10 |
| 4 | 5D | Silicon oxide | 25 | 10 | <10 |
| 5 | 5E | Silicon oxide | 25 | 10 | 15 |
| 6 | 5F | Silicon oxide | 25 | 10 | <10 |
| 7 | 5G | Silicon oxide | 25 | 10 | 15 |
| 8 | 5H | Silicon oxide | 25 | 10 | 21 |
| 9 | 5I | Silicon oxide | 25 | 10 | 20 |
| 10 | 5J | Silicon oxide | 25 | 10 | <10 |
| 11 | 5K | Silicon oxide | 25 | 10 | 13 |
| 12 | 5L | Silicon oxide | 25 | 10 | 12 |
| 13 | 5M | Silicon oxide | 25 | 10 | 11 |

TABLE 7

| Liquid composition | Compound and concentration thereof (% by mass) |
|---|---|
| 7A | Hexamethyldisilazane: 1%, Toluene: 99% |
| 7B | Octyldimethylsilyldimethylamine: 1%, Toluene: 99% |
| 7C | Trimethylsilyldimethylamine: 1%, Toluene: 99% |
| 7D | Tetramethylsilane: 1%, Toluene: 99% |
| 7E | Perfluorodecyltrimethoxysilane: 1%, Sulfuric acid: 3%, Water: 96% |

TABLE 8

| Comparative Examples | Liquid composition | Substrate material | Temperature/ °C. | Immersion time/ min | Water contact angle/degree | IPA contact angle/degree |
|---|---|---|---|---|---|---|
| 14 | 7A | Silicon oxide | 60 | 2 | 42 | <10 |
| 15 | 7A | Silicon oxide | 60 | 10 | 53 | <10 |
| 16 | 7B | Silicon oxide | 25 | 2 | 89 | <10 |
| 17 | 7B | Silicon oxide | 25 | 10 | 99 | <10 |
| 18 | 7B | Silicon oxide | 60 | 2 | 101 | <10 |
| 19 | 7B | Silicon oxide | 60 | 10 | 104 | <10 |
| 20 | 7B | Silicon nitride | 25 | 2 | 83 | <10 |
| 21 | 7B | Silicon nitride | 25 | 10 | 82 | <10 |
| 22 | 7B | Silicon nitride | 60 | 2 | 93 | <10 |
| 23 | 7B | Silicon nitride | 60 | 10 | 90 | <10 |
| 24 | 7C | Silicon oxide | 25 | 2 | 68 | <10 |
| 25 | 7C | Silicon oxide | 25 | 10 | 83 | <10 |
| 26 | 7C | Silicon oxide | 60 | 2 | 77 | <10 |
| 27 | 7C | Silicon oxide | 60 | 10 | 90 | <10 |
| 28 | 7D | Silicon oxide | 60 | 10 | 34 | <10 |
| 29 | 7E | Silicon oxide | 25 | 2 | 110 | <10 |
| 30 | 7E | Silicon oxide | 25 | 10 | 109 | 21 |
| 31 | 7E | Silicon oxide | 60 | 2 | 110 | <10 |
| 32 | 7E | Silicon oxide | 60 | 10 | 107 | 13 |
| 33 | 7E | Silicon nitride | 25 | 2 | 41 | <10 |
| 34 | 7E | Silicon nitride | 25 | 10 | 90 | <10 |
| 35 | 7E | Silicon nitride | 60 | 2 | 56 | <10 |
| 36 | 7E | Silicon nitride | 60 | 10 | 92 | <10 |

Comparative Examples 37-40

Into an airtight container, 9.5% by mass of $CH_2=CH-COO-(CH_2)_2-(CF_2)_6-F$, 40% by mass of $CH_2=C(CH_3)-COO-(CH_2)_2-(CF_2)_6-F$, 0.5% by mass of $CH_2=CH-COO-C_2H_4O-CO-C_2H_4-COOH$, 0.17% by mass of dimethyl 2,2'-azobis(isobutyrate) and 49.83% by mass of m-xylenehexafluoride were fed, and the mixture was reacted at 70° C. for 18 hours to obtain a polymer 9A. 15% by mass of the polymer 9A was mixed with 85% by mass of m-xylenehexafluoride to obtain a liquid composition 9B (not containing two or more of the compounds represented by formulae (1) to (6)). After the substrate materials were subjected to the surface treatment using the liquid composition 9B under conditions shown in Table 9, the contact angle with IPA was less than 30°. From the results, it was understood that the surface treatment agent described in Patent Document 5 does not exert alcohol repellency.

TABLE 9

| Comparative Examples | Liquid composition | Substrate material | Temperature/ ° C. | Immersion time/ min | IPA contact angle/ degree |
|---|---|---|---|---|---|
| 37 | 9B | Silicon oxide | 25 | 2 | <10 |
| 38 | 9B | Silicon oxide | 25 | 2 | <10 |
| 39 | 9B | Silicon oxide | 60 | 10 | <10 |
| 40 | 9B | Silicon oxide | 60 | 10 | <10 |

The invention claimed is:

1. A surface treatment method for a semiconductor substrate, which comprises bringing the semiconductor substrate into contact with a liquid composition to impart alcohol repellency to the semiconductor substrate, wherein the liquid composition comprises: 0.01 to 15% by mass of each of at least two compounds selected from surfactants respectively represented by formulae (1) to (6) and salts thereof; and water:

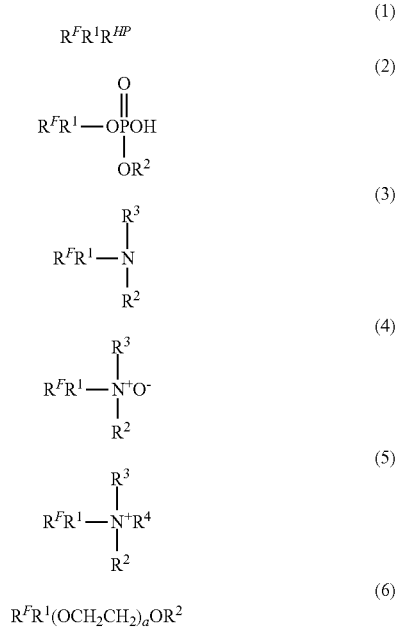

wherein:
$R^F$ is selected from the group consisting of substituents obtained by substituting a hydrogen atom with a fluorine atom in an alkyl group having 2 to 10 carbon atoms, an alkenyl group having 2 to 10 carbon atoms, an alkynyl group having 2 to 10 carbon atoms, an aryl group or an alkylether group having 2 to 10 carbon atoms;
$R^1$ is selected from the group consisting of a covalent bond, an alkylene group having 1 to 6 carbon atoms, an alkenylene group having 1 to 6 carbon atoms, an alkynylene group having 1 to 6 carbon atoms, an arylene group, an alkylene ether group having 1 to 6 carbon atoms, and a substituent obtained by substituting a hydrogen atom in any of said groups with a hydroxyl group, a carboxyl group or an amino group;
$R^{HP}$ is selected from the group consisting of a hydroxyl group, a sulfonic acid group and a carboxyl group;
$R^2$, $R^3$ and $R^4$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^FR^1$, and a substituent obtained by substituting a hydrogen atom in any of said groups with a hydroxyl group, a carboxyl group, $NR^5R^6$, $N^+O^-R^5R^6$ or $N^+R^5R^6R^7X^-$;
$R^5$, $R^6$ and $R^7$ are a hydrogen atom or selected from the group consisting of an alkyl group having 1 to 6 carbon atoms, an alkenyl group having 1 to 6 carbon atoms, an alkynyl group having 1 to 6 carbon atoms, an aryl group, an alkylether group having 1 to 6 carbon atoms, $R^FR^1$, and a substituent obtained by substituting a hydrogen atom in any of said groups with a hydroxyl group, a carboxyl group or an amino group;
$X^-$ is selected from the group consisting of a hydroxide ion, a fluoride ion, a chloride ion, a bromide ion, a iodide ion, a nitrate ion, a phosphate ion, a sulfate ion, a hydrogen sulfate ion, a methanesulfate ion, a perchlorate ion, an acetate ion, a fluoroborate ion and a trifluoroacetate ion; and
a represents an integer of 3 to 20.

2. The surface treatment method for the semiconductor substrate according to claim 1, wherein the surfactants do not contain any perfluoroalkyl group having 8 or more carbon atoms.

3. The surface treatment method for the semiconductor substrate according to claim 1, wherein the surfactants comprise a compound which contains nitrogen in a hydrophilic group thereof.

4. The surface treatment method for the semiconductor substrate according to claim 1, wherein said alcohol repellency is isopropyl alcohol repellency.

5. The surface treatment method for the semiconductor substrate according to claim 1, wherein the semiconductor substrate contains at least one material selected from the group consisting of silicon, aluminum, aluminum copper alloy, tantalum, nickel, tungsten, cobalt, molybdenum, titanium, zirconium, ruthenium, hafnium, platinum, silicon germanium, germanium, and an oxide, a nitride and a carbide thereof.

6. The surface treatment method for the semiconductor substrate according to claim 1, wherein the liquid composition further comprises an organic solvent.

7. The surface treatment method for the semiconductor substrate according to claim 6, wherein the organic solvent is at least one selected from the group consisting of isopropyl alcohol, acetone and DMF.

8. The surface treatment method for the semiconductor substrate according to claim 1, wherein the liquid composition further comprises an acid or an alkali as an additive.

9. The surface treatment method for the semiconductor substrate according to claim 8, wherein the additive is sulfuric acid.

* * * * *